(12) United States Patent
Won et al.

(10) Patent No.: US 8,547,766 B2
(45) Date of Patent: Oct. 1, 2013

(54) AREA-EFFICIENT DATA LINE LAYOUTS TO SUPPRESS THE DEGRADATION OF ELECTRICAL CHARACTERISTICS

(75) Inventors: Jong-Hak Won, Hwaseong-si (KR); Hyang-Ja Yang, Suwon-si (KR); Choong-Sun Shin, Seongnam-si (KR); Hak-Soo Yu, Seongnam-si (KR); Young-Soo An, Yongin-si (KR); Jung-Hyeon Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 417 days.

(21) Appl. No.: 12/659,883

(22) Filed: Mar. 24, 2010

(65) Prior Publication Data
US 2010/0259963 A1    Oct. 14, 2010

(30) Foreign Application Priority Data
Apr. 9, 2009    (KR) .................. 10-2009-0031021

(51) Int. Cl.
*G11C 5/06*    (2006.01)
(52) U.S. Cl.
USPC .......... 365/214; 365/51; 365/63; 365/189.17; 365/189.05; 365/208; 365/207

(58) Field of Classification Search
USPC ................ 365/51, 63, 189.17, 189.05, 208, 365/207, 214
See application file for complete search history.

(56) References Cited

U.S. PATENT DOCUMENTS

| 5,621,679 | A  | * | 4/1997 | Seo et al. | ........................ | 365/63 |
| 7,259,978 | B2 | * | 8/2007 | Park et al. | ....................... | 365/63 |

FOREIGN PATENT DOCUMENTS

| KR | 10-0331912 | 3/2002 |
| KR | 10-0582821 | 5/2006 |
| KR | 10-0591764 | 6/2006 |

OTHER PUBLICATIONS

Abstract of KR 10-2000-0011704 published on Feb. 25, 2000.
Abstract of KR 10-2005-0110132 published on Nov. 23, 2005.
Abstract of KR 10-2005-0022855 published on Mar. 8, 2005.

* cited by examiner

*Primary Examiner* — Andrew Q Tran
(74) *Attorney, Agent, or Firm* — Harness, Dickey & Pierce, P.L.C.

(57) ABSTRACT

A data line layout includes column selection lines arranged in a first direction at a layer on a memory cell array region, and data lines arranged in the first direction at the layer, the data lines being connected between I/O sense amplifiers and I/O pads.

16 Claims, 6 Drawing Sheets

AREA-EFFICIENT DATA LINE LAYOUTS TO SUPPRESS THE DEGRADATION OF ELECTRICAL CHARACTERISTICS

CROSS-REFERENCE TO RELATED APPLICATION

This application claims priority under 35 U.S.C. §119 to Korean Patent Application No. 2009-0031021, filed on Apr. 9, 2009, in the Korean Intellectual Property Office (KIPO), the entire contents of which is incorporated herein by reference.

BACKGROUND

1. Field

Example embodiments of the inventive concepts relate to semiconductor memory devices, and in particular, to data line layouts of conductive lines connected between I/O sense amplifiers and I/O pads in a semiconductor memory device.

2. Description of the Related Art

Semiconductor memory devices may include banks having a plurality of memory cells to improve data transmission rates and each bank may be divided into a plurality of DRAM array cell blocks. A bit line sense amplifier for controlling the input of data to each cell block or the output of data from each cell block may be connected to global input/output (I/O) lines through local I/O lines. The global I/O lines may be shared by all cell blocks of a corresponding bank and may be connected through a global I/O sense amplifier to data bus lines which may be shared by all banks. The data bus lines may be connected to corresponding data I/O pads.

Data bus lines are disposed in a peripheral region around a cell array region, resulting in long conductive paths. For this reason, it may be difficult to reduce the size of a chip and electrical characteristics may be degraded.

SUMMARY

Example embodiments of the inventive concepts relate data line layouts capable of shortening conductive paths of data bus lines which may allow reduction in the size of a chip and improve electrical characteristics.

According to example embodiments of the inventive concepts, a data line layout may include arranging column selection lines in a first direction at a layer, and arranging data lines in the first line at the layer, the data lines being connected between I/O sense amplifiers and I/O pads.

The data lines may be arranged on a cell array region. The I/O sense amplifiers may include local I/O sense amplifiers and global I/O sense amplifiers, and the data lines may be arranged between the global I/O sense amplifiers and the I/O pads. The data lines may include global I/O lines connected between the local I/O sense amplifiers and the global I/O sense amplifiers. Local I/O lines may be arranged in a second direction intersecting the first direction to be connected between the local I/O sense amplifiers and bit line sense amplifiers. The bit line sense amplifiers may be connected to bit lines, and be switched in response to a column selection signal applied to the column selection lines. The bit lines may go across a cell array area. The local I/O lines may be formed below the data lines and the global I/O lines.

According to example embodiments of the inventive concepts, a data line layout may include a column selection line arranged in a first direction in a layer and a data line arranged in the first direction in the layer.

According to example embodiments of the inventive concepts, data bus lines may be arranged in parallel with column selection lines formed at a layer in which the column selection lines are formed on a memory cell array region, shortening conductive paths so as to reduce the size of a chip and to improve electrical characteristics.

BRIEF DESCRIPTION OF THE DRAWINGS

Example embodiments will be more clearly understood from the following brief description taken in conjunction with the accompanying drawings.

FIG. 1 is a circuit diagram illustrating a data line layout according to example embodiments of the inventive concepts;

FIG. 2 is a plan view illustrating a layout of the wiring lines shown in FIG. 1;

FIG. 3 is a perspective diagram illustrating the region RA shown in FIG. 2;

FIG. 4 is a plan view illustrating data bus lines on a memory cell array region;

FIG. 5 is a schematic diagram roughly illustrating a memory card 500 according to example embodiments; and FIG. 6 is a block diagram roughly illustrating an electronic system 600 according to example embodiments.

Figure 1:
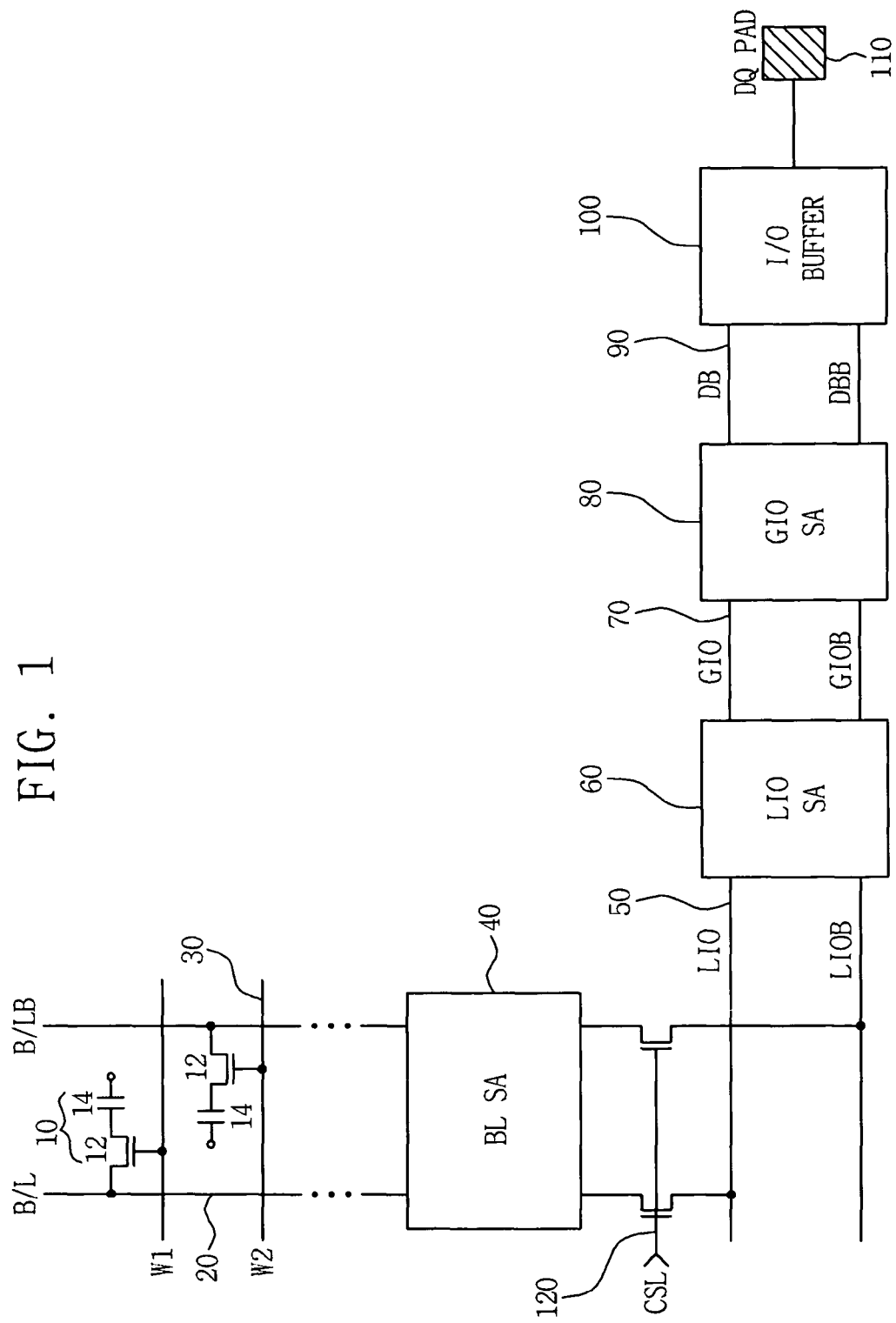
FIGS. 1-6 represent non-limiting, example embodiments as described herein.

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a data line layout according to example embodiments of the inventive concepts. Referring to FIG. 1, memory cells 10, sense amplifiers 40, 60, and 80, an I/O buffer 100, and/or a data pad 110 may be connected by conductive (e.g., metal) lines 20, 30, 50, 70, 90, and/or 120 in order to input and output data signals. Each memory cell 10 may include a transistor 12 and a capacitor 14. The memory cells 10 may be formed as storage units at the intersections of word lines 30 (e.g., W1 and/or W2), bit lines B/L, and complementary bit lines B/LB. The bit lines and the complementary bit lines, which may be pairs, may be generically referred to as bit lines 20. The word lines 30 may switch the transistors 12 of the memory cells 10 on and/or off. The bit lines 20 may input and/or output data. The word lines 30 and/or the bit lines 20 may be on a substrate 13 (shown in FIG. 3) at a layer including the transistors 12 and/or another layer close thereto.

The sense amplifiers 40, 60, and 80, the I/O buffer 100, and/or the data pad 110 may be connected by local I/O lines 50 (e.g., LIO and/or LIOB), global I/O lines 70 (e.g., GIO and/or GIOB), a column selection line 120 (e.g., CSL), and/or data bus lines 90 (e.g., DB and/or DBB) which may be conductive (e.g., metal) wiring lines on the memory cells 10. The local I/O lines 50 may connect a bit line sense amplifier 40 and a local I/O sense amplifier 60. The global I/O lines 70 may connect the local I/O sense amplifier 60 and a global I/O sense amplifier 80. The data bus lines 90 may connect the global I/O sense amplifier 80 and at least one of the I/O buffer 100 and the data pad 110. The conductive lines may be provided in pairs and may be electrically connected (e.g., by contact plugs) to the memory cells 10 and/or transistors of the sense amplifiers 40, 60, and 80 which may be formed below the conductive lines.

A process of forming conductive wiring lines on memory cells may be called a back end process. According to example embodiments, most of the conductive wiring lines may be sequentially stacked on the memory cells 10. For example, the local I/O lines 50 may be formed as first conductive wiring lines on the memory cells 10, a fourth interlayer insulation layer 39 (shown in FIG. 3) may be formed to cover the local I/O lines, and the column selection line 120, the global I/O lines 70, and/or the data bus lines 90 may be formed as second conductive wiring lines (e.g., second metal wiring lines) on the fourth interlayer insulation layer.

Figure 2:
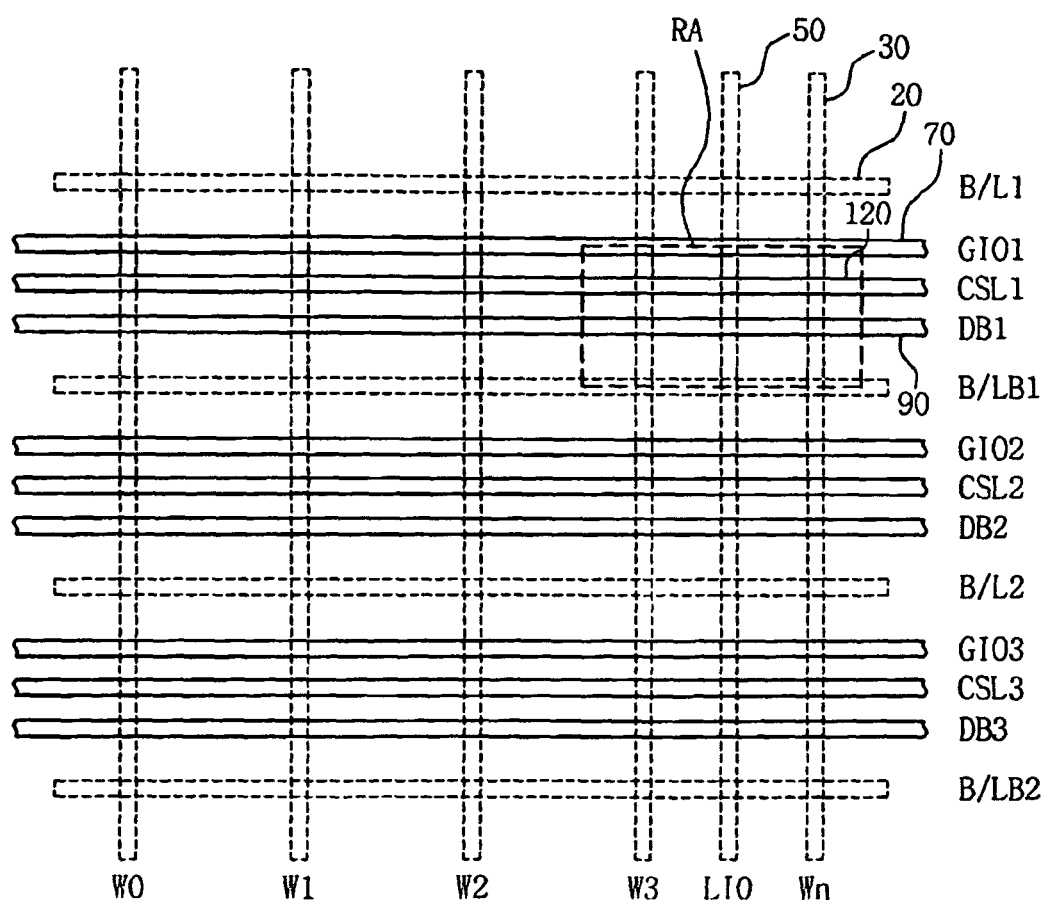

FIG. 2 is a plan view illustrating a layout of the wiring lines shown in FIG. 1. Referring to FIG. 2, the local I/O lines 50 (e.g., LIO) may be on the memory cells 10 in parallel with the word lines 30 (e.g., W0, W1, W2, W3 ... IG. 2 is a plan view illustratnes 120 (e.g., CSL1, CSL2, and/or CSL3), the global I/O lines 70 (e.g., GIO1, GIO2 and/or GIO3), and/or the data bus lines 90 (e.g., DB1, DB2 and/or DB3) may be in parallel with the bit lines 20 (e.g., B/L1, B/LB1, B/L2 and/or B/LB2). The column selection line 120, the global I/O lines 70, and/or the data bus lines 90 may be second conductive wiring lines in the same layer in parallel with one another, which may result in greater and/or improved efficiency of space use. The column selection line 120, the global I/O lines 70, and/or the data bus lines 90 may be alternately and/or separately arranged. The column selection line 120, the global I/O lines 70, and/or the data bus lines 90 may be connected to the same memory cell 10 of a bank (e.g., a bank 210 shown in FIG. 4) and/or different memory cells 10 of different banks.

Although not shown in the drawings, a word line selection line WSL may be additionally in parallel with the local I/O lines 50 to receive a word line selection signal for selecting one of the plurality of word lines 30.

Figure 3:
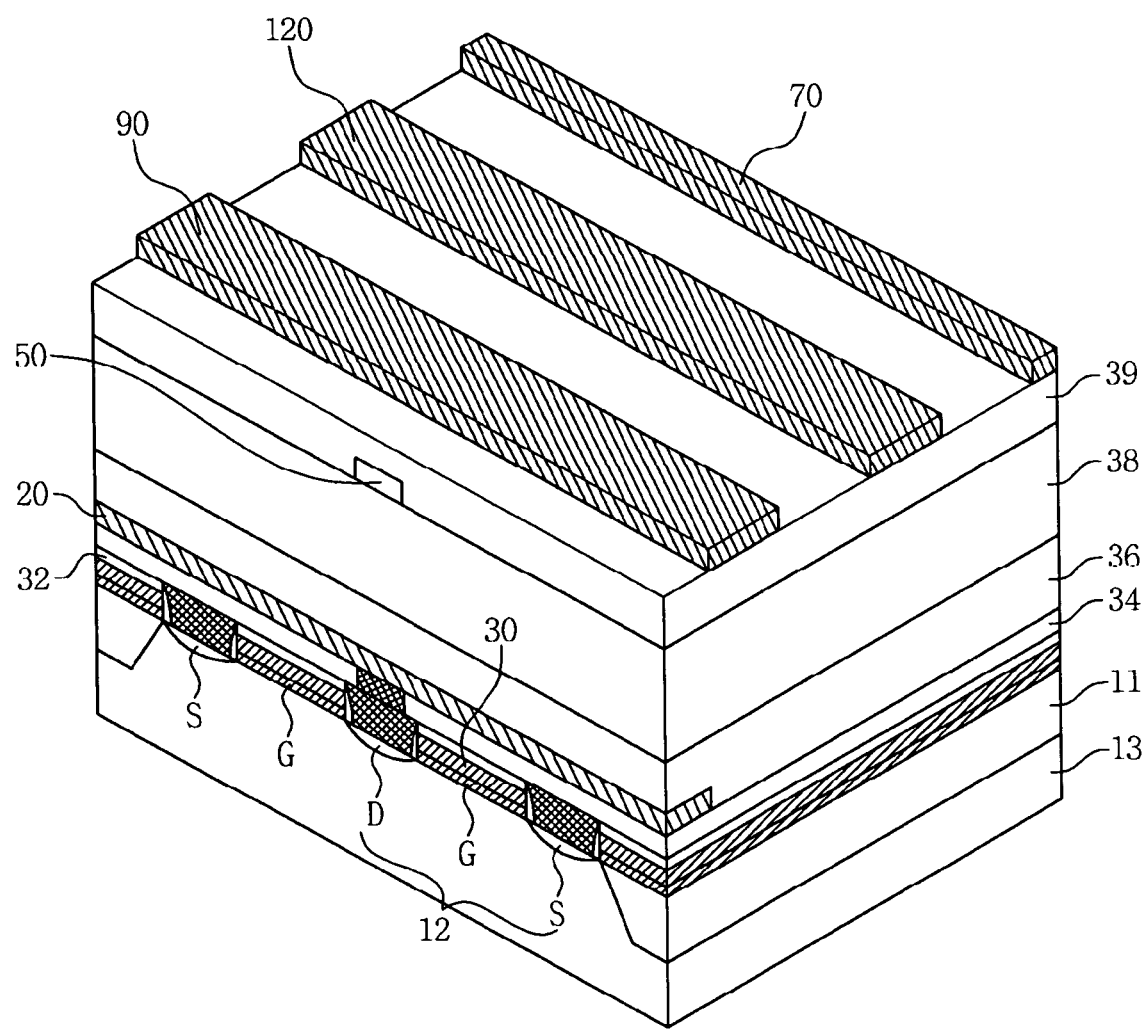

FIG. 3 is a perspective diagram illustrating the region RA shown in FIG. 2. Referring to FIG. 3, the transistors 12 having sources S, drains D, and/or gates G may be on a substrate 13. A first interlayer insulation layer 34 may be on the transistors 12. The bit lines 20 may be in a first direction on the first interlayer insulation layer 34 and may be electrically connected to the drains D of the transistors 12. The transistors may be independently formed due to element separation films 11 in the substrate 13. Word lines 30 may be in a second direction to be electrically connected to the gates G of the transistors 12. The bit lines 20 may be electrically insulated from the word lines 30 by an upper gate insulation layer 32 and/or the first interlayer insulation layer 34.

A second interlayer insulation layer 36 and a third interlayer insulation layer 38 may be on the substrate 13 and/or the bit lines 20. The local I/O lines 50 may be in the second direction on the third interlayer insulation layer 38. The fourth interlayer insulation layer 39 may be on the substrate 13 and the local I/O lines 50. The column selection line 120, the global I/O lines 70, and/or the data bus lines 90 may be in the first direction on the fourth interlayer insulation layer 39. The column selection line 120, the global I/O lines 70, and/or the data bus lines 90 may be the same material and may be in the same layer.

Although not shown in the drawings, the capacitors 14 may be, for example, between the second interlayer insulation layer 36 and the third interlayer insulation layer 38. The capacitors 14 may be electrically connected to DC contact plugs connected to the sources S of the transistors 12. In data line layouts according to example embodiments of the inventive concepts, the column selection line 120, the global I/O lines 70, and/or the data bus lines 90 may be in the same direction at the same layer on a memory cell array region. According to the related art, word lines 30 and bit lines 20 may be on a memory cell array region and data bus lines 90 may be on a peripheral region 220 (shown in FIG. 4) around the memory cell array region. According to the related art, the data bus lines 90 may be third wiring lines formed through a separate photolithography process on the memory cell array region having the column selection lines 120 and/or the global I/O lines 70 formed thereon, resulting in high and/or increased costs and low and/or decreased productivity.

A method of arranging the data bus lines 90 at a layer including the column selection line 120 and/or the global I/O lines 70 on the memory cell array area, unlike the related art in which data bus lines are arranged within a peripheral region 220 (shown in FIG. 4), may be described as follows.

According to example embodiments of the inventive concepts, a fewer number of column selection lines 120 may be used and the data bus lines 90 may be on the memory cell array region. For example, each of column selection lines 120 may be arranged to be shared by, for example, four or eight local I/O lines 50, unlike the related art in which each column selection line may be shared by two local I/O lines. A fewer number of column selection lines 120 may be used and the number of data bus lines 90, which may be proportional to the decrease in the number of column selection lines, may be on the memory cell array region.

Figure 4:
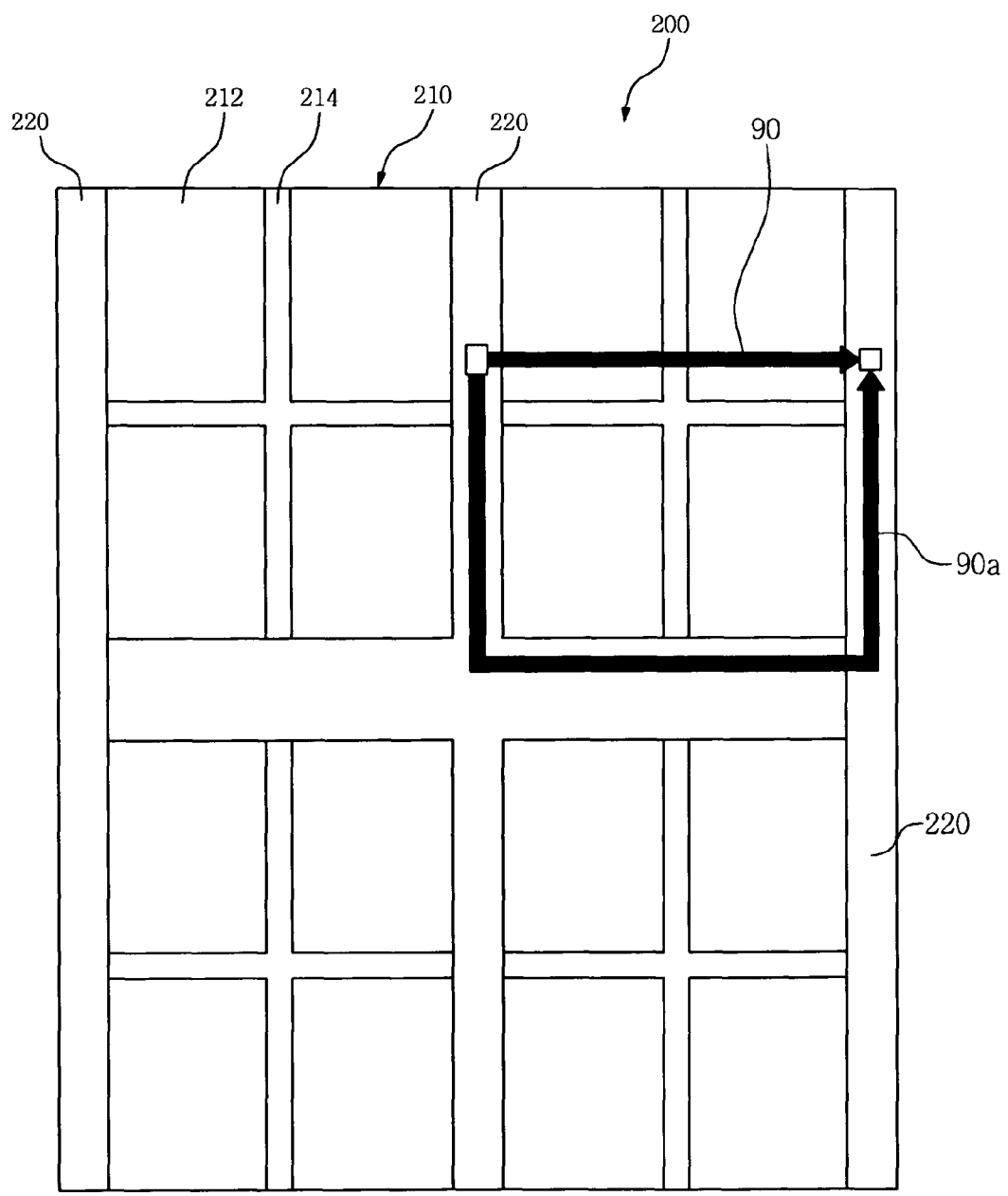

FIG. 4 is a plan view illustrating data bus lines 90 on a memory cell array region. In FIG. 4, a portion of the data bus lines 90 may pass through the memory cell array region in contrast with general data bus lines 90a (e.g., related art bus lines 90a), a portion of which may pass through a peripheral region, resulting in a decrease in the lengths of wiring lines. According to example embodiments of the inventive concepts, it may be possible to reduce the size of a chip and to achieve superior and/or improved electrical characteristics.

A semiconductor memory device chip 200 may include, for example, four banks 210 and a peripheral region 220. The banks 210 may include a plurality of memory cells 10 and may be a type of memory cell array region. Each bank 210 may be divided into a plurality of cell blocks 212. A bit line sense amplifier 40 and/or a local I/O sense amplifier 60 (shown in FIG. 1) may be in a region 214 among the cell blocks 212. A global I/O sense amplifier 80 and/or a data pad 110 may be formed in the peripheral region 220. Wiring lines 50, 60, 90, and/or 120 connecting the above-mentioned sense amplifiers and the data pad may be over the memory cell array region and the peripheral region 220.

According to example embodiments of the inventive concepts, data bus lines 90 may extend from the global I/O sense amplifier 80 in an inner region of the semiconductor memory device chip 200 to the I/O buffer 100 and/or the data pad 110 in an outer region of the semiconductor memory device chip 200, and may be arranged on the memory cell array region, resulting in lengths of the data bus lines 90 that may be shorter than the data bus lines 90a. Because the lengths of the data bus lines 90 may be shorter, it may be possible to reduce the size of a semiconductor memory device chip 200 and/or to improve the electrical characteristics.

For example, the data bus lines 90 may extend a relatively short and/or decreased length of about 5900 μm from a portion of the peripheral region 220 in the inner region of the semiconductor memory device chip 200 to a portion of the peripheral region 220 in the outer region of the semiconductor memory device chip 200 through the memory cell array region. According to the related art, the general data bus lines 90a may be formed a relatively long length of about 14500 μm along only the peripheral region 220.

According to example embodiments of the inventive concepts, when a global I/O sense amplifier 80 in a portion of the peripheral region 220 in the inner region of the semiconductor memory device chip 200 is not parallel with an I/O buffer 100 in a portion of the peripheral region 220 in the outer region of the semiconductor memory device chip 200, a part of the data bus lines 90 may be in the peripheral region 220.

Figure 5:
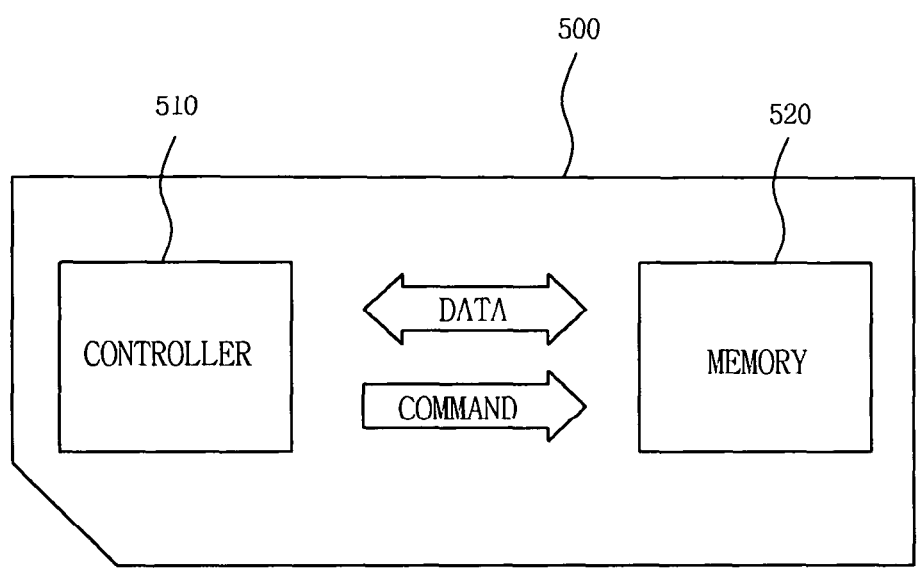

FIG. 5 is a schematic diagram illustrating a memory card 500 according to example embodiments of the inventive concepts. Referring to FIG. 5, a controller 510 and a memory 520 may exchange electric signals. For example, according to commands of the controller 510, the memory 520 and the controller 510 may exchange data. The memory card 500 may either store data in the memory 520 or output data from the memory 520. The memory 520 may include a device including a data line layout as described above in reference to FIGS. 1-4.

Such a memory card 500 may be used as a storage medium for various portable electronic devices. For example, the memory card 500 may be a multimedia card (MMC) or a secure digital (SD) card.

Figure 6:
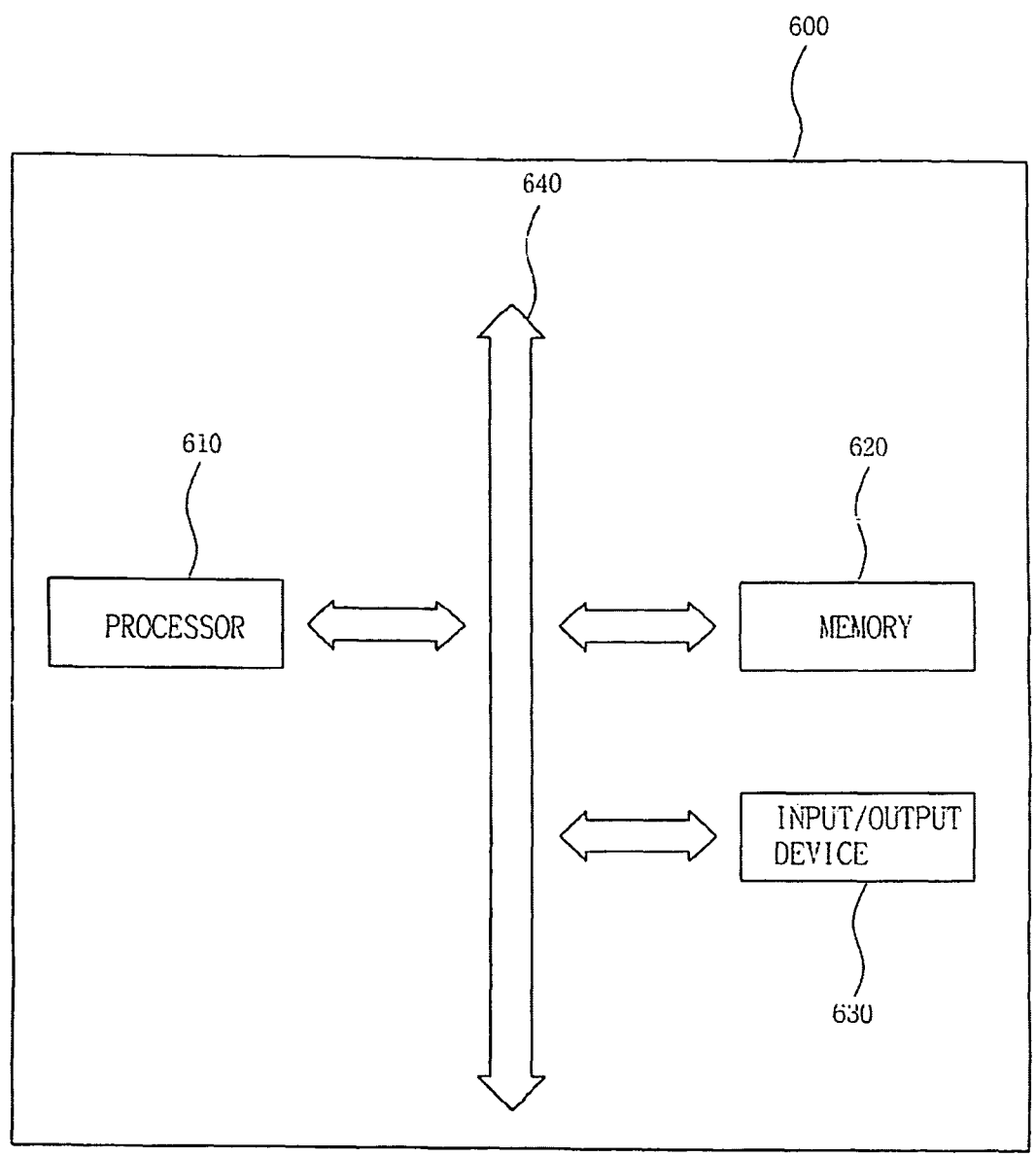

FIG. 6 is a block diagram roughly illustrating an electronic system 600 according to example embodiments of the inventive concepts. Referring to FIG. 6, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device (e.g., a personal computer and/or a network) by using the input/output device 630 and may exchange data with the external device.

The memory 620 may store codes or programs for operations of the processor 610. For example, the memory 620 may include a device including a data line layout as described above in reference to FIGS. 1-4. For example, such an electronic system 600 may embody various electronic control systems requiring the memory 620, and, for example, may be used in mobile phones, MP3 players, navigation devices, solid state disks (SSD), and/or household appliances.

In the data line layout according to example embodiments of the inventive concepts, column selection lines 120, global I/O lines 70, and/or data bus lines 90 may be arranged in the same direction in the same layer on a memory cell array region, and may reduce the size of a semiconductor memory device chip 200 and/or improve electrical characteristics of a semiconductor memory device chip 200.

While example embodiments have been particularly shown and described, it will be understood by one of ordinary skill in the art that variations in form and detail may be made therein without departing from the spirit and scope of the claims.

What is claimed is:

1. A data line layout, comprising:
a column selection line arranged in a first direction in a layer; and
a data bus line arranged in the first direction in the layer, the data bus line connected to a global I/O sense amplifier and an I/O pad, and the data bus line arranged on a cell array region, wherein a set of the column selection line and the data bus line are in parallel with each other and horizontally interposed between a pair of a bit line and a complementary bit line, and the set of the column selection line and the data bus line are formed in a first layer and the pair of bit lines is formed in a second layer.

2. The layout of claim 1, wherein the column selection line is shared by more than two local I/O lines.

3. The layout of claim 1, wherein the data bus line is a plurality of data bus lines,
the global I/O sense amplifier is a plurality of global I/O sense amplifiers, and
the global I/O sense amplifier is configured to be connected to a local I/O sense amplifier.

4. The layout of claim 3, wherein the data bus lines are arranged between the global I/O sense amplifier and the I/O pad.

5. The layout of claim 3, further comprising:
a global I/O line arranged in the first direction in the layer, the global I/O line connected between the local I/O sense amplifier and the global I/O sense amplifier.

6. The layout of claim 3, further comprising:
a local I/O line arranged in a second direction intersecting the first direction and connected between the local I/O sense amplifier and a bit line sense amplifier,
wherein the bit line sense amplifier is connected to the bit line, the bit line crossing the cell array region.

7. The layout of claim 6, wherein the bit line is arranged in the first direction.

8. The layout of claim 6, wherein the local I/O line is configured to be switched in response to a column selection signal applied to the column selection line.

9. The layout of claim 8, further comprising a global I/O line arranged in the first direction in the layer,
wherein the local I/O line is arranged in a different layer than the layer including the data bus line, the column selection line and the global I/O line.

10. The layout of claim 1, further comprising:
a global I/O line arranged in the first direction in the layer, wherein the layer is in the cell array region.

11. The layout of claim 10, further comprising:
a local I/O line arranged in a second direction intersecting the first direction.

12. The layout of claim 11, further comprising:
a word line selection line arranged in the second direction intersecting the first direction;
the bit line arranged in the first direction; and
a word line arranged in the second direction.

13. The layout of claim 1, wherein the data bus line is less than about 14500 µm in length.

14. A semiconductor memory device configured according to the layout of claim 1.

15. An electronic system comprising a semiconductor device configured according to the layout of claim 1.

16. The layout of claim 1, wherein the set further comprises a global I/O line in the first layer, the global I/O line connected between a local I/O sense amplifier and the global I/O sense amplifier.

* * * * *